(12) United States Patent
Norman

(10) Patent No.: US 6,730,527 B1
(45) Date of Patent: May 4, 2004

(54) CHIP AND DEFECT TOLERANT METHOD OF MOUNTING SAME TO A SUBSTRATE

(75) Inventor: Richard Norman, Sutton (CA)

(73) Assignee: Hyperchip Inc., Montréal (CA)

( * ) Notice: Subject to any disclaimer, the term of this patent is extended or adjusted under 35 U.S.C. 154(b) by 0 days.

(21) Appl. No.: 10/330,067

(22) Filed: Dec. 30, 2002

Related U.S. Application Data

(60) Provisional application No. 60/343,218, filed on Dec. 31, 2001.

(51) Int. Cl.[7] ............................ H01L 21/00; H01L 23/48
(52) U.S. Cl. ................................ 438/4; 438/12; 438/15; 257/773; 257/786; 714/10
(58) Field of Search ...................... 438/4, 7, 10, 12, 438/14, 15, 17, 107, 115; 257/773, 782, 784, 786; 714/2, 10, 25

(56) References Cited

U.S. PATENT DOCUMENTS

| | | |
|---|---|---|
| 4,703,436 A | 10/1987 | Varshney |
| 4,778,771 A | 10/1988 | Hiki |
| 4,829,014 A | 5/1989 | Yerman |
| 5,266,890 A | 11/1993 | Kumbasar et al. |
| 5,514,613 A | 5/1996 | Santadrea et al. |
| 5,570,032 A | 10/1996 | Atkins et al. |
| 5,581,562 A | 12/1996 | Lin et al. |
| 5,679,609 A * | 10/1997 | Aimi et al. .................. 438/6 |
| 5,761,145 A | 6/1998 | Zagar et al. |
| 5,831,445 A | 11/1998 | Atkins et al. |
| 5,878,052 A | 3/1999 | Kimura |
| 6,119,049 A | 9/2000 | Peddle |
| 6,154,855 A * | 11/2000 | Norman .................. 714/10 |
| 6,265,232 B1 | 7/2001 | Simmons |
| 6,274,390 B1 * | 8/2001 | Akram et al. .............. 438/4 |
| 6,408,402 B1 * | 6/2002 | Norman .................. 714/10 |
| 6,472,239 B2 * | 10/2002 | Hembree et al. ............ 438/18 |
| 6,506,634 B1 * | 1/2003 | Kohyama ................ 438/132 |
| 6,597,362 B1 * | 7/2003 | Norman .................. 712/28 |
| 6,636,986 B2 * | 10/2003 | Norman .................. 714/10 |
| 6,645,841 B2 * | 11/2003 | Kever .................... 438/598 |

FOREIGN PATENT DOCUMENTS

| | | |
|---|---|---|
| EP | 0283186 A2 | 9/1988 |
| JP | 62155528 A2 | 7/1987 |
| JP | 63129639 A2 | 6/1988 |
| JP | 63211642 A | 9/1988 |
| JP | 63299352 A | 12/1988 |
| JP | 1184934 A2 | 7/1989 |
| JP | 05047934 A | 2/1993 |
| JP | 5047934 A2 | 2/1993 |
| JP | 5129419 A2 | 5/1993 |
| JP | 8213464 A2 | 8/1996 |
| JP | 2001094013 A2 | 4/2001 |
| JP | 2001094013 A | 4/2001 |
| TW | 0432566 B | 5/2001 |

* cited by examiner

Primary Examiner—Kevin M. Picardat

(57) ABSTRACT

A substrate is provided with a plurality of regions, at least one of which is operationally redundant. An integrated circuit to be placed onto the substrate has a plurality of functional units that are designed to be interchangeable. The integrated circuit is tested for defects and, if a functional unit is found to be defective, then the integrated circuit is oriented (e.g., rotated or translated) with respect to the substrate such that the defective functional unit overlies the operationally redundant region of the substrate. A functional association is then formed between the remaining regions of the substrate and the non-defective functional units of the integrated circuit. Such functional association may be achieved by connecting each pair of unit and region. In this way, an integrated circuit with defective functional unit need not be discarded.

31 Claims, 8 Drawing Sheets

CHIP AND DEFECT TOLERANT METHOD OF MOUNTING SAME TO A SUBSTRATE

CROSS-REFERENCES TO RELATED APPLICATIONS

The present application claims the benefit under 35 USC 119(e) of prior U.S. Patent Application Ser. No. 60/343,218 to Richard Norman, filed on Dec. 31, 2001 now abandoned and incorporated by reference herein.

FIELD OF THE INVENTION

The present invention is related to integrated circuits and, more particularly, to methods for placing an integrated circuit onto a substrate, such methods being tolerant of defects in the integrated circuit.

BACKGROUND OF THE INVENTION

In the electronics industry, there exist various ways of mounting a semiconductor body containing an integrated circuit onto a substrate such as a circuit board. For instance, it is common to first package the semiconductor body as a "chip", and then to attach the packaged chip to the substrate.

One common technique for fabricating a packaged chip involves placing the semiconductor body in contact with a redistribution layer, which rearranges the dense array of contact points on the semiconductor body in such a way that they are more easily accessible from the external world via a set of "pins". The electrical connection between the contact points of the redistribution layer and the contact points of the semiconductor body is commonly achieved by wire-bonding or flip-chip techniques. The pins are manufactured in such a way that they can easily engage with complementary contacts on the circuit board. Accordingly, connections between the pins of the packaged chip and the contacts on the circuit board can be achieved by way of bonding (soldering) or by providing releasable frictional connectors.

Typically, the substrate onto which the packaged chip is placed includes functional units that are designed to interact with functional units on the integrated circuit. Since each pin of the chip leads to a corresponding functional unit of the integrated circuit, and since each contact of the substrate leads to a corresponding functional unit of the substrate, there is conventionally only a single orientation in which the package can be placed vis-à-vis the substrate so that the desired interaction between the functional units is achieved.

However, during manufacture of an integrated circuit, the integrated circuit is formed may be affected by a defect. This defect may occur in a key region of the integrated circuit and thus it is possible that one or more of the functional units on the integrated circuit will be defective. As a result, the functional units of the substrate which are uniquely associated with the defective functional unit(s) of the integrated circuit prevent the desired overall functionality of the chip from being achieved. Under such circumstances, the chip becomes useless and needs to be discarded.

It should therefore be apparent that in a conventional chip-to-substrate assembly process, it may be necessary to go through several integrated chips until one with zero defective functional units is found, at which point the desired functionality of the chip can be realized upon assembly. A similar problem also arises in other manufacturing techniques whereby the semiconductor body is placed directly onto a circuit board. Clearly, procedures in which integrated circuits are discarded are extremely costly and wasteful, especially since the discarded integrated circuits may in actuality still contain multiple non-defective functional units.

SUMMARY OF THE INVENTION

It has been recognized that many types of integrated circuits, such as gate arrays, crossbars, memories, etc., contain multiple functional units that have a similar or an identical architecture. By "architecture" of a functional unit is meant the physical arrangement of circuit elements associated with the functional unit. In some cases, full-mesh interconnectivity is provided amongst a set of the functional units, while in other cases, no connections are provided between any of the functional units. Additionally, in some instances, different functional units may assume different functional roles by virtue of being programmable. In any event, for many types of integrated circuits, different functional units are often interchangeable. The present invention exploits this interchangeability to provide a method of assembling a chip that results in less overall wastage of integrated circuits.

Specifically, a substrate is provided with a plurality of regions, at least one of which is operationally redundant. The integrated circuit is tested for defects and, if a functional unit is found to be defective, then the integrated circuit is oriented (e.g., rotated, translated or a combination of a translation and a rotation) with respect to the substrate such that the defective functional unit registers with the operationally redundant region of the substrate. A functional association is then formed between the remaining regions of the substrate and the non-defective functional units of the integrated circuit. Such functional association may be achieved by connecting each pair of unit and region. In this way, an integrated circuit with defective functional unit need not be discarded if the defective functional unit is made to register with the operationally redundant region of the substrate.

Therefore, the invention may be summarized according to a first broad aspect as a chip assembly, including a body of semiconductor material including an integrated circuit. The integrated circuit has a plurality of externally communicating functional units, at least one of which is defective. The chip assembly also includes a substrate on which the body of semiconductor material is mounted. The substrate has a plurality of regions, at least one of which is operationally redundant. The body of semiconductor material is positioned on the substrate such that each externally communicating functional unit other than the externally communicating functional unit that is defective is functionally associated with a respective one of the plurality of regions other than the region that is operationally redundant.

According to a second broad aspect, the present invention may be summarized as a combination of a body of semiconductor material and a substrate for receiving the body of semiconductor material. The body of semiconductor material has an integrated circuit having a plurality of externally communicating functional units, at least one of which is defective. The substrate has a plurality of regions, at least one of which is operationally redundant. The body of semiconductor material is capable of acquiring a first position and a second position on the substrate. In the first position, each externally communicating functional unit faces a first respective one of the plurality of regions, the externally communicating functional unit that is defective facing the region that is operationally redundant. In the second position, each externally communicating functional unit faces a second respective one of the plurality of regions, the externally communicating functional unit that is defective facing a region that is other than the region that is operationally redundant.

The present invention may be summarized according to a third broad aspect as a method of mounting a body of semiconductor material to a substrate. The method includes testing the integrated circuit for the presence of an externally communicating functional unit that is defective. If a defective externally communicating functional unit is found, the method further includes mounting the body of semiconductor material on the substrate such that the defective externally communicating functional unit registers with the region that is operationally redundant.

According to a fourth broad aspect, the invention may be summarized as a method of positioning a body of semiconductor material with respect to a substrate which includes testing the integrated circuit for the presence of a externally communicating functional unit that is defective and, if a defective externally communicating functional unit is found, orienting the body of semiconductor material on the substrate such that the defective externally communicating functional unit overlies the region that is operationally redundant.

The present invention may be summarized according to a fifth broad aspect as a method of positioning a body of semiconductor material with respect to a marker positioning device. The body of semiconductor material includes an integrated circuit having a plurality of externally communicating functional units. The method includes testing the integrated circuit for the presence of a externally communicating functional unit that is defective. The method further includes applying a marker to a surface of the semiconductor body. According to this fifth broad aspect, if a defective externally communicating functional unit is found, the body of semiconductor material needs to be oriented with respect to the marker positioning device prior to application of the marker in such a way that the marker, when applied, occupies a pre-determined orientation with respect to the defective externally communicating functional unit.

These and other aspects and features of the present invention will now become apparent to those of ordinary skill in the art upon review of the following description of specific embodiments of the invention in conjunction with the accompanying drawings.

DETAILED DESCRIPTION OF THE PREFERRED EMBODIMENTS

Figure 1:
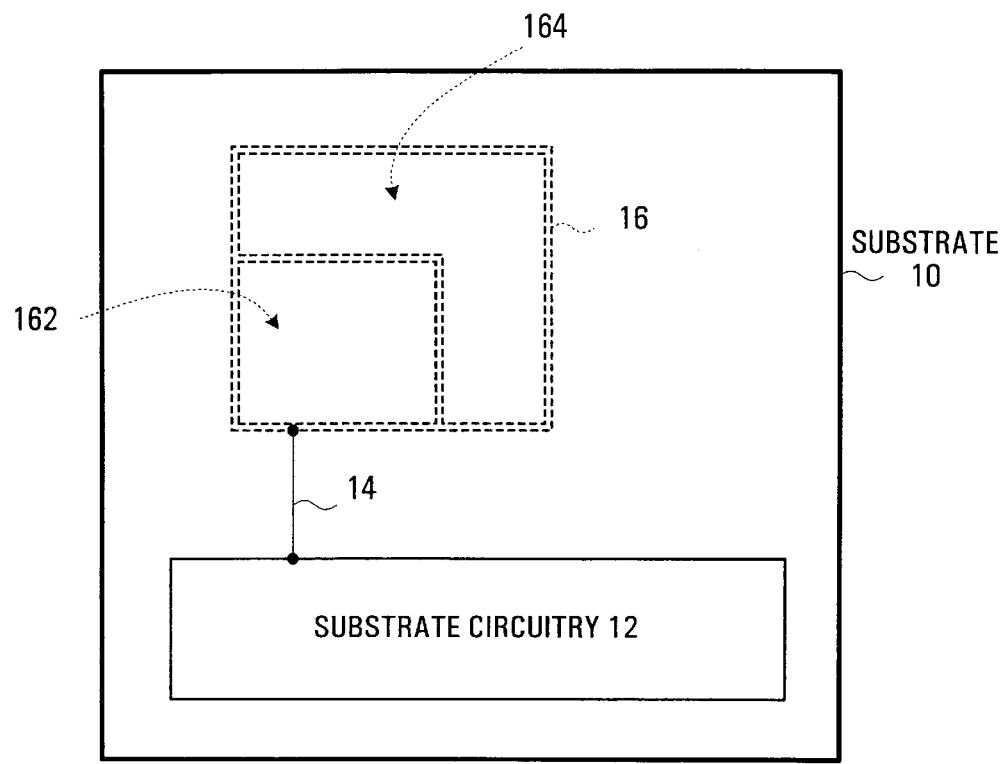
FIG. 1 shows a substrate capable of accommodating an integrated circuit and having an operationally redundant region, in accordance with an embodiment of the present invention.

With reference to FIG. 1, there is shown a substrate 10 having a bonding area 16 onto which a body of semiconductor material, e.g., an integrated circuit, is to be mounted. Suitable substrates include a circuit board, a redistribution layer, a dielectric film and any other material currently or prospectively used as a substrate for a semiconductor material. The bonding area 16 includes a plurality of regions. At least one of the regions, shown in this case as a single region at 162, is operationally redundant. By "operationally redundant" it is meant that either (1) it does not contribute to the overall processing functionality of the chip assembly formed by application of the integrated circuit to the substrate 10 within the bonding area 16 or (2) it can contribute to the overall processing functionality of the chip assembly although it is not necessary for region 162 and the circuitry connected to it to be in use. Meanwhile, however, the operationally redundant region 162 may nonetheless be relied upon to provide connect non-operationally-redundant regions 164 of the substrate 10 with an environment external to the integrated circuit.

The environment on the substrate 10 to which a mounted integrated circuit eventually connects can include substrate circuitry 12 that may interface to an off-substrate environment via a set of connectors (not shown). In the illustrated embodiment, access to the non-operationally-redundant regions 164 of the substrate 10 is provided by a single substrate connector 14 that is connected between the substrate circuitry 12 and the operationally redundant region 162 of the substrate 10. Thus, for the purposes of this example, it is assumed that the operationally redundant region 162 of the substrate 10 continues to provide connectivity upon mounting of an integrated circuit. However, in other examples (see FIG. 4), the reverse is true, the non-operationally-redundant regions 164 of the substrate are connected directly to the substrate circuitry 12 without passing through in the operationally redundant region 162.

Both situations illustrate non-limiting example embodiments falling within the scope of the present invention.

Figure 2:
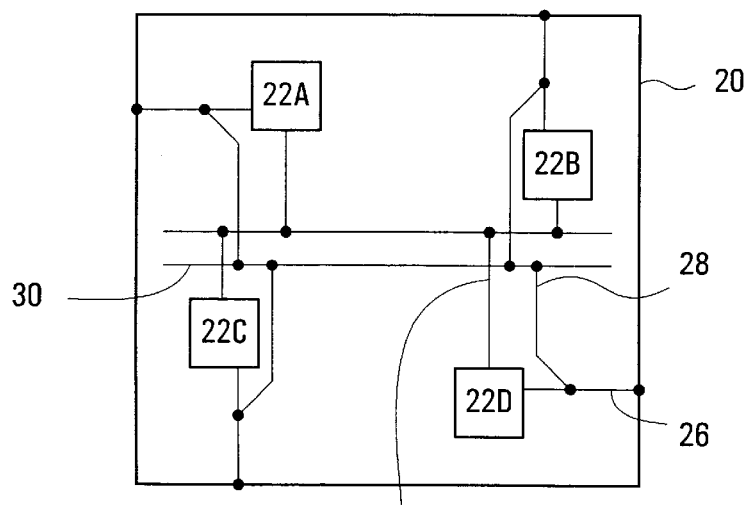
FIG. 2 shows a rectangular body of semiconductor material having a plurality of externally communicating functional units.

With reference to FIG. 2, there is shown a body of semiconductor material 20, e.g., an integrated circuit, comprising a plurality of externally communicating functional units 22, also termed "cells" in some contexts. By "externally communicating functional unit" is meant a unit of the integrated circuit 20 that is exposed to the external world and that can communicate with a region of the substrate 10 that is associated with it. This excludes parts of an integrated circuit 20 where such part is functionally enclosed by the rest of the circuit, such that the part does not exchange signals directly with the substrate 10.

The cells 22 are interchangeable. Thus, the cells 22 may be identical from an architectural point of view. In some embodiments of the invention, each of the cells 22 may be a stand-alone entity and none of the cells 22 are interconnected. In other embodiments of the invention, such as the one shown in FIG. 2, the cells 22 are interconnected to one another by an interconnect pattern 30. The interconnect pattern 30 may include a set of internal connectors 28 (i.e., for establishing connections between the cells 22) and a set of external connectors 26 (i.e., for establishing connections between the cells 22 and the substrate 10). The interconnect pattern 30 may be structured as a bus for connecting the internal and/or external connectors to one another. It should be understood that for some integrated circuits 10, such as a programmable gate array or a microprocessor array, each cell 22 performs a unique function although the architecture of each cell is similar or identical.

Any given subset of the cells 22 may acquire a defect during the manufacturing process. This subset may include a single cell or more than one cell. As will now be shown in greater detail, the present invention allows tolerance of defects in any or all cells occupying an area of the integrated circuit 20 that can be as large as the area of the operationally redundant region 162 of the substrate 10. Thus, in the case of the substrate 10 of FIG. 1 and the integrated circuit 20 of FIG. 2, up to one defective cell can be tolerated. This, however is only an example and designs that can tolerate more than one defective cell are within the scope of the invention.

Figure 3A:
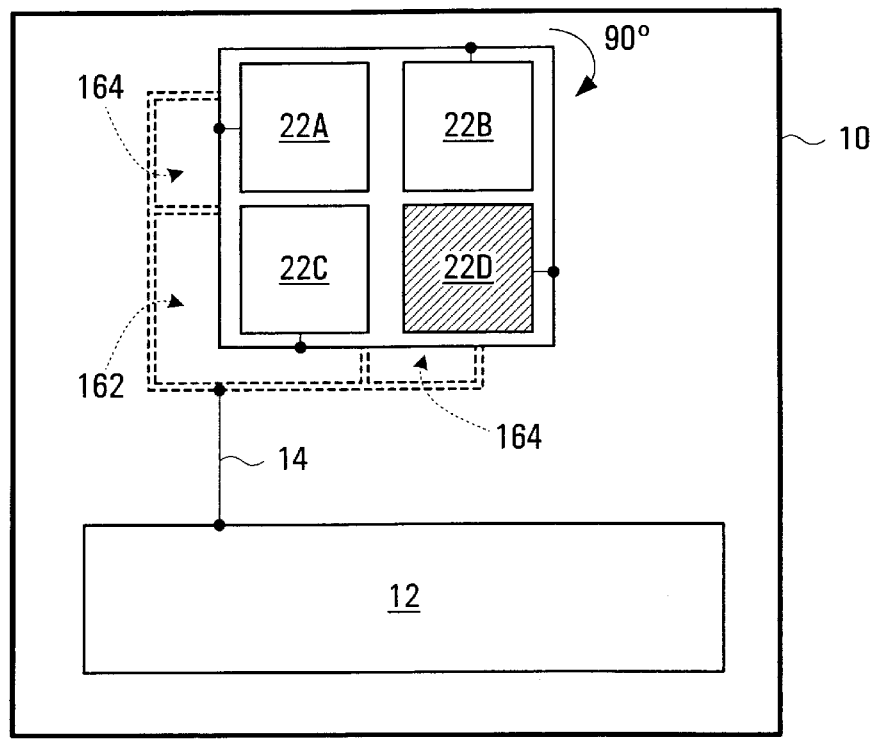
FIG. 3A shows a rectangular body of semiconductor material having a defective functional unit and about to be overlaid onto the substrate of FIG. 1.

With reference to FIG. 3A, there is shown the integrated circuit 20 of FIG. 2 in preparation for being laid onto the substrate 10 of FIG. 1. The integrated circuit 20 is tested for the presence of a defect by any suitable technique, including such techniques known to those of ordinary skill in the art. As a result, let it be assumed that a cell 22D was found to be defective. As can be seen from FIG. 3A, the defective cell 22D occupies an area of the integrated circuit 20 that is no greater than the operationally redundant region 162 of the substrate 10. However, simply mounting the integrated circuit 20 onto the bonding area 16 of the substrate 10 in the orientation shown in FIG. 3 will result in the substrate connector 14 connecting to a non-defective cell (in particular, cell 22C). Meanwhile, the defective cell 22D will occupy part of the non-operationally-redundant region 164 of the substrate and hence will prevent the integrated circuit/substrate combination from being fully functional.

Figure 3B:
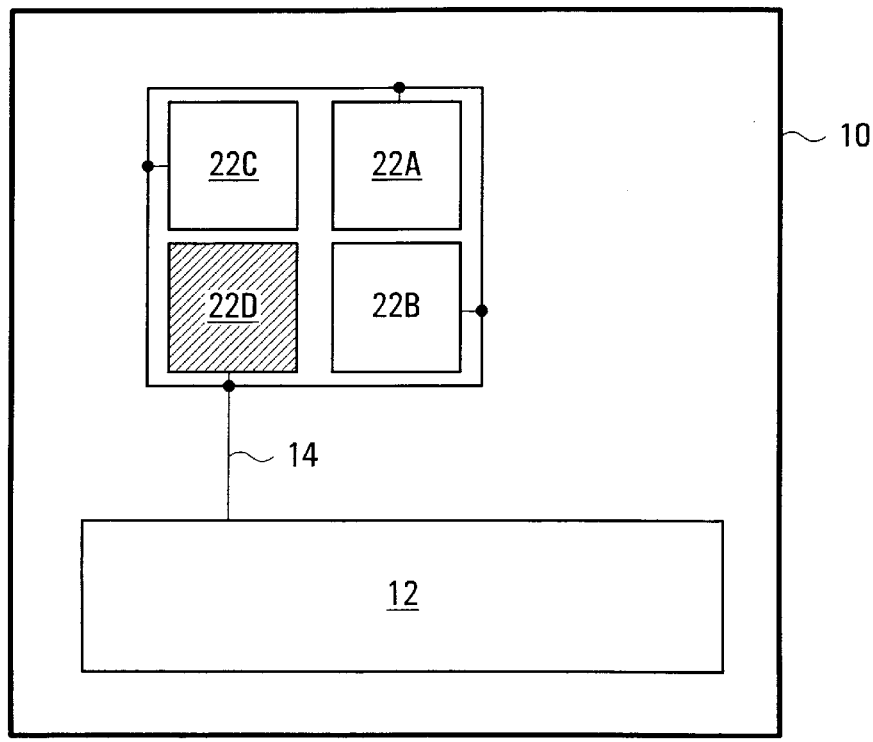
FIG. 3B shows the body and substrate of FIG. 2 with the body rotated so that the defective functional unit overlies the operationally redundant region.

To solve this problem, an embodiment of the present invention, illustrated in FIG. 3B, provides for rotation of the integrated circuit 20 such that the defective cell 22D overlies the operationally redundant region 162 of the substrate 10. Thus, the defective cell 22D is made to register with the operationally redundant region 162 of the substrate. A direct signal transmission channel can then be provided between the integrated circuit 20 and the substrate 10. This may take the form of standard contact elements used to achieve electrical contact between cell 22D and the substrate connector 14. By way of example, the signal transmission channel can be implemented by electrical conductors (e.g., traces, pads, etc.) or optical links.

In this way, the substrate circuitry 12 has access to the non-defective cells 22A, 22B, 22C through substrate connector 14 and defective cell 22D. More generally, it can be said that the non-defective cells 22A, 22B, 22C are functionally associated with the non-operationally-redundant region 164 of the substrate 10. Conversely, one can define the operationally redundant region 162 of the bonding area 16 as the portion of the bonding area 16 that is not functionally associated with a non-defective cell.

The above-described embodiment has been described in the context where the substrate 10 is a circuit board and the integrated circuit 10 is a pre-packaged chip. Thus, the present invention is seen to have advantages where a chip is tested prior to being connected to a circuit board and, if the defects are concentrated to within a region of the chip no bigger than the operationally redundant region of the bonding template, the chip is oriented until the defective cell(s) face the operationally redundant region of the substrate. Affixing of the chip to the substrate may then take place.

Nevertheless, the present invention is applicable to situations in which testing for defects is performed at the chip manufacturing facility. Upon identifying a defective cell or cells, the chip may be oriented and a marker placed on the chip in such a way as to uniquely identify the location of the defective cell or cells within the chip. For example, a logo having a known orientation can be printed on the chip, with the chip and/or the logo print head device rotated prior to printing so that the orientation of the logo uniquely specifies in which region the defective cells, if any, are located. Hence, upon assembly of the chip to the circuit board, one can ensure that the defective cells are being properly positioned with respect to the operationally redundant region(s) of the bonding area by positioning the chip in such a way that a predetermined orientation of the logo is attained.

It should also be noted that in some embodiments, the substrate 10 may be implemented as a redistribution layer defining an operationally redundant region. A re-orientation of the integrated circuit in the above-described manner is effected prior to placement of the integrated circuit in contact with the redistribution layer.

Figure 4:
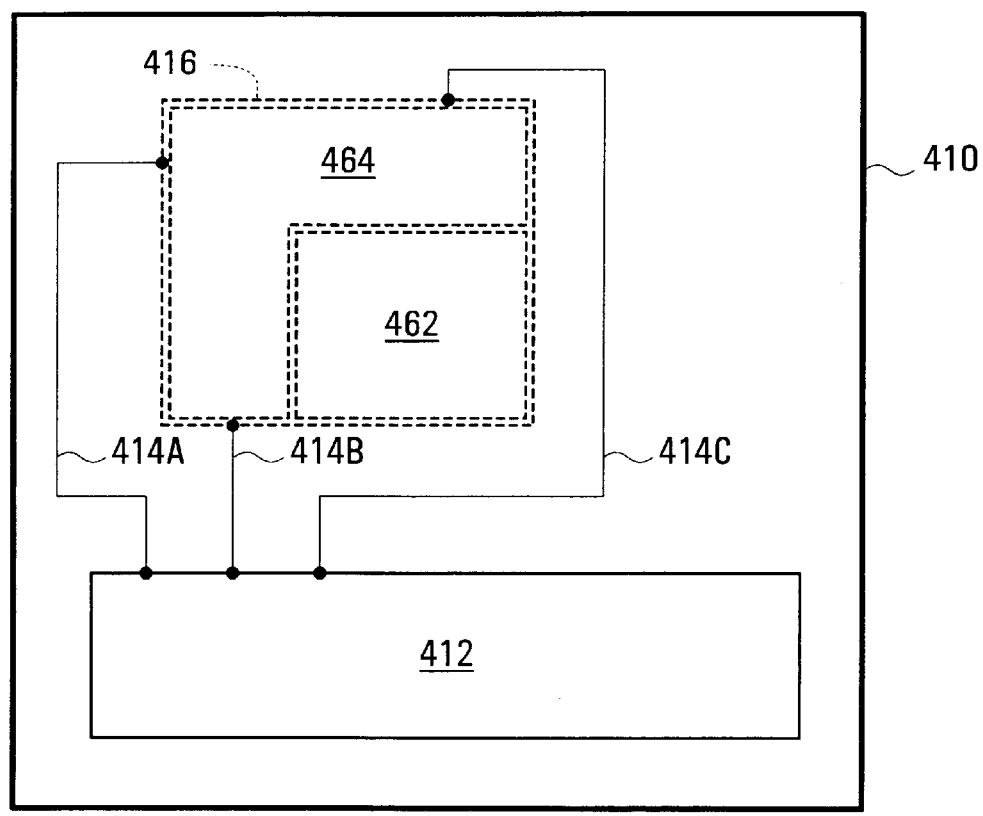
FIG. 4 shows a substrate capable of accommodating an integrated circuit and having an operationally redundant region, in accordance with another embodiment of the present invention.

In the above embodiments, the defective cell 22D is assumed to be capable of providing connectivity despite any functional defects it may contain. In other embodiments of the present invention, this might not be the case. For example, with reference to FIG. 4, there is shown an embodiment of the present invention wherein the operationally redundant region 462 of the substrate 410 occupies a lower right-hand quadrant of the bonding area 416, and wherein connectors 414A, 414B, 414C are provided between the substrate circuitry 412 and the region of the substrate 410 that is non-operationally-redundant, this being region 464. In the embodiment of FIG. 4, as in the embodiment of FIGS. 1–3, the non-operationally-redundant region 464 of the substrate is to be functionally associated with non-defective cells.

Figure 5A:
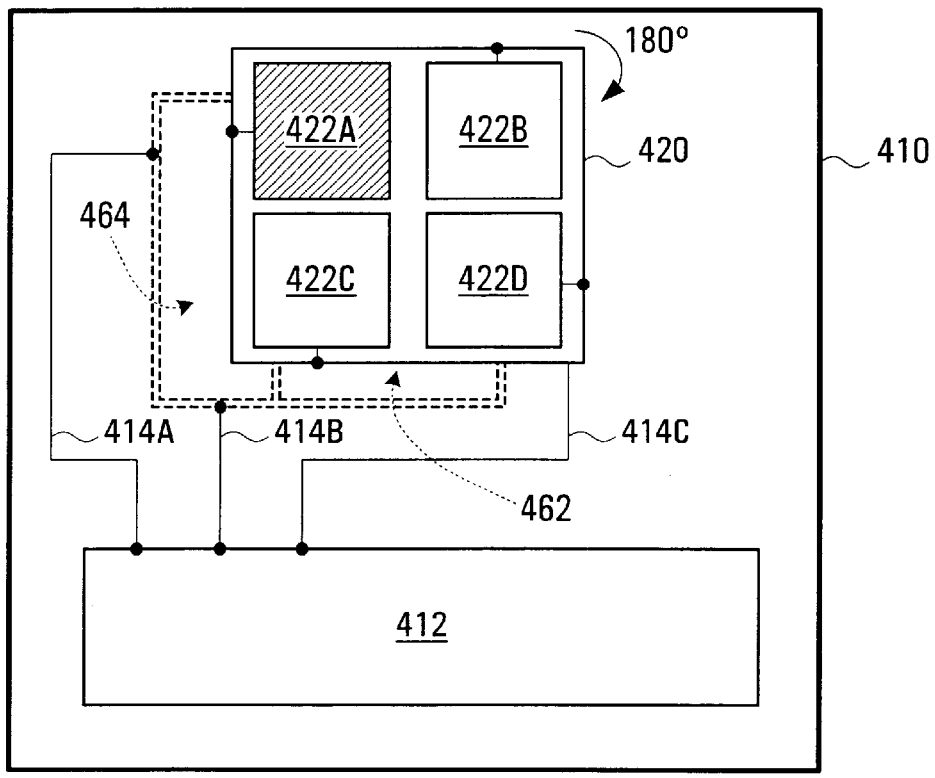
FIG. 5A shows a rectangular body of semiconductor material having a defective functional unit and about to be overlaid onto the substrate of FIG. 4.
Figure 5B:
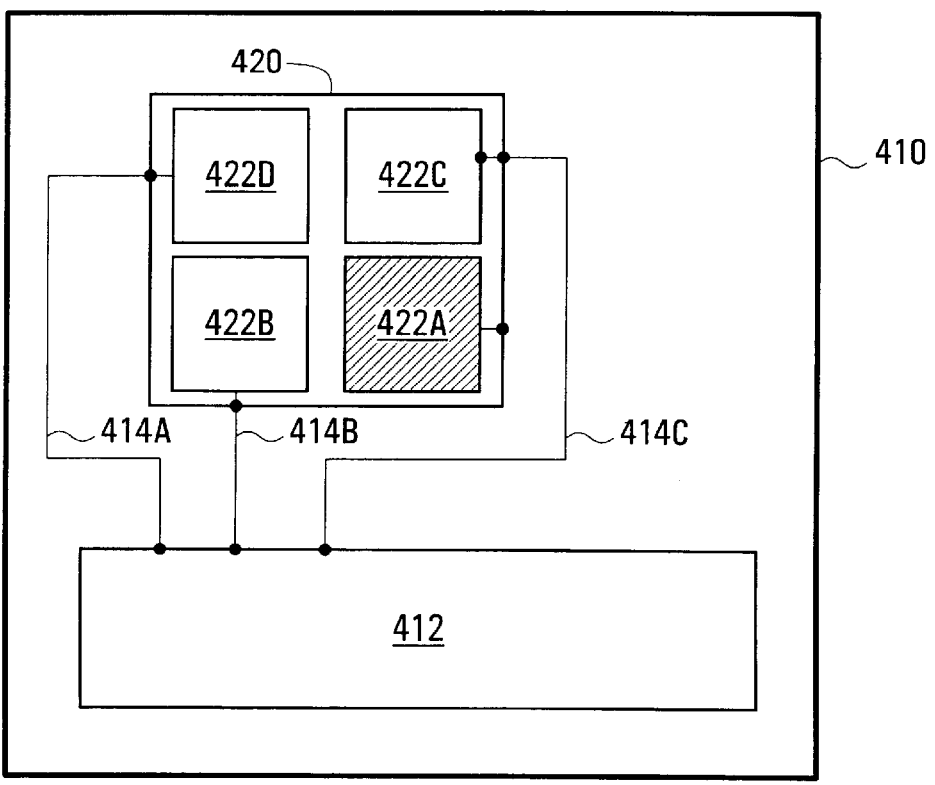
FIG. 5B shows the body and substrate of FIG. 4 with the body rotated so that the defective functional unit overlies the operationally redundant region.

With reference to FIG. 5A, there is shown an integrated circuit that contains a defective cell 422A in the top left-hand quadrant, whereas the operationally redundant region 462 of the substrate 410 is in the lower left-hand quadrant of the bonding area 416. Thus, the integrated circuit 420 (or the substrate 410) needs to be rotated so that the defective cell 422A overlies the operationally redundant region 462 of the substrate 410. To this end, FIG. 5B shows the situation in which the integrated circuit 420 has been rotated so that the defective cell 422A now overlies the operationally redundant region 462 of the substrate 410.

Figure 6:
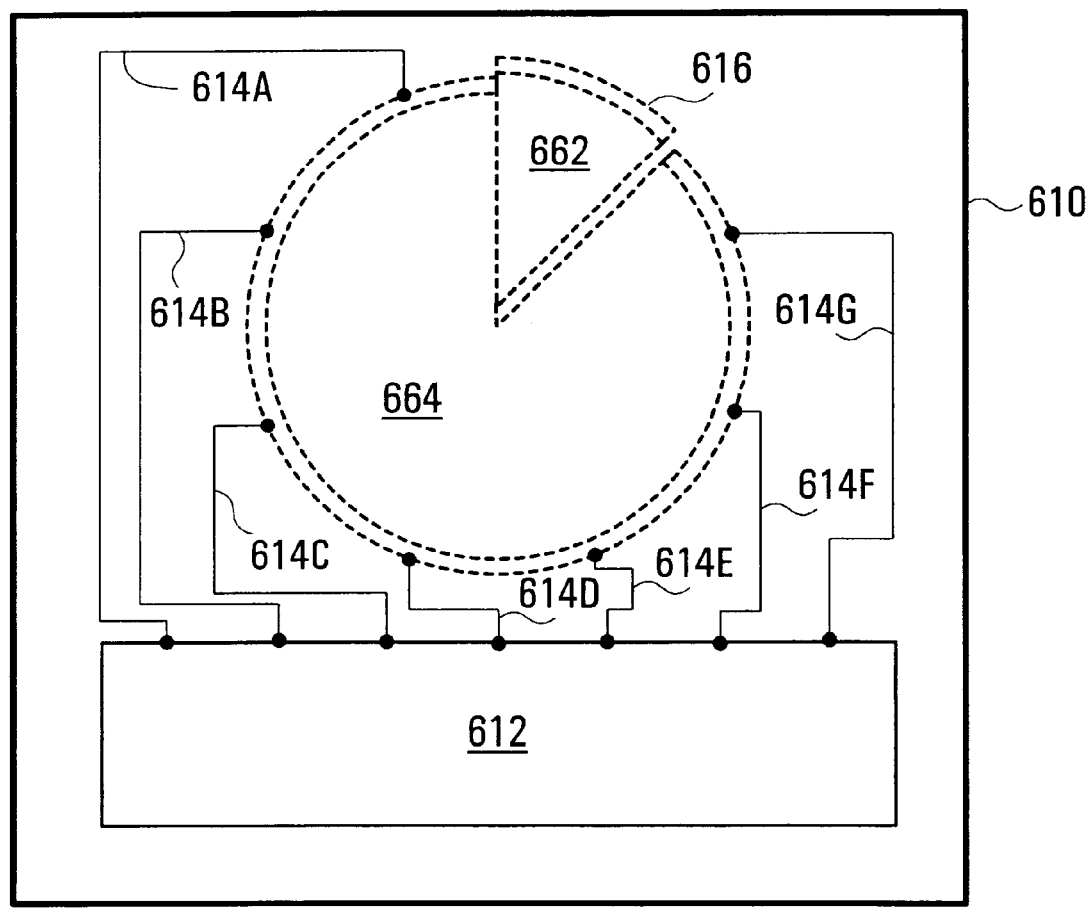
FIG. 6 shows a substrate capable of accommodating an integrated circuit and having a operationally redundant region, in accordance with yet another embodiment of the present invention.

Reference is now made to FIG. 6, in which there is shown a substrate 610 with a bonding area 616 that is circular. The bonding area 616 includes a plurality of regions, of which region 662 is operationally redundant and region 664 is operational. In this embodiment, the regions are sectors of the circularly shaped bonding area 616. Connectors 614A–614G are provided between substrate circuitry 612 and the region of the substrate 610 that is non-operationally-redundant, this being region 664.

Figure 7A:
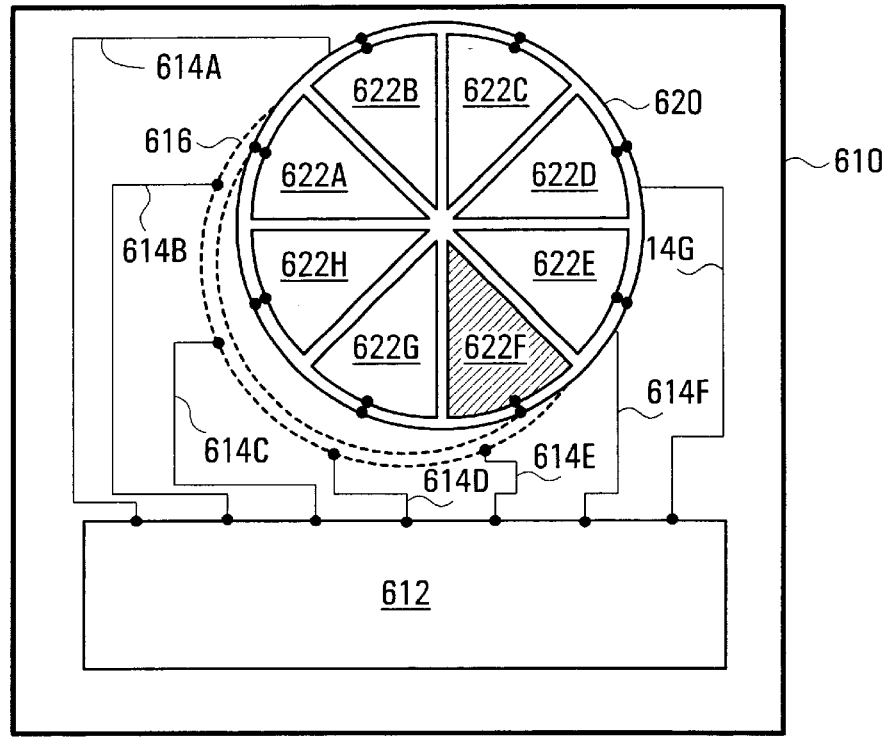
FIG. 7A shows a circular body of semiconductor material having a defective functional unit and about to be overlaid onto the substrate of FIG. 6.
Figure 7B:
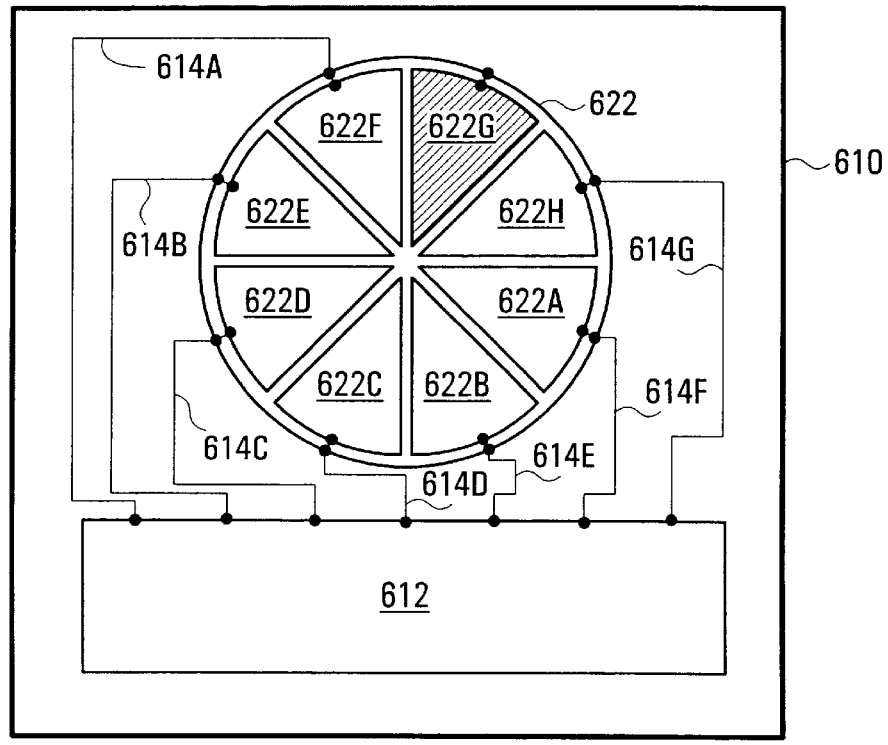
FIG. 7B shows the body and substrate of FIG. 6 with the body rotated so that the defective functional unit overlies the operationally redundant region.

In FIG. 7A, there is shown an integrated circuit 620 that contains a defective cell 622F in the south-south-west sector, whereas the operationally redundant region 664 of the substrate 610 corresponds to the north-north-east sector of the bonding area 616. Thus, the integrated circuit 620 needs to be rotated so that the defective cell 622F may overlay the operationally redundant region 662 of the substrate 610. Accordingly, FIG. 7B shows the situation in which the integrated circuit 620 has been rotated so that the defective cell 622A now indeed overlies the operationally redundant region 662 of the substrate 610.

Figure 8:
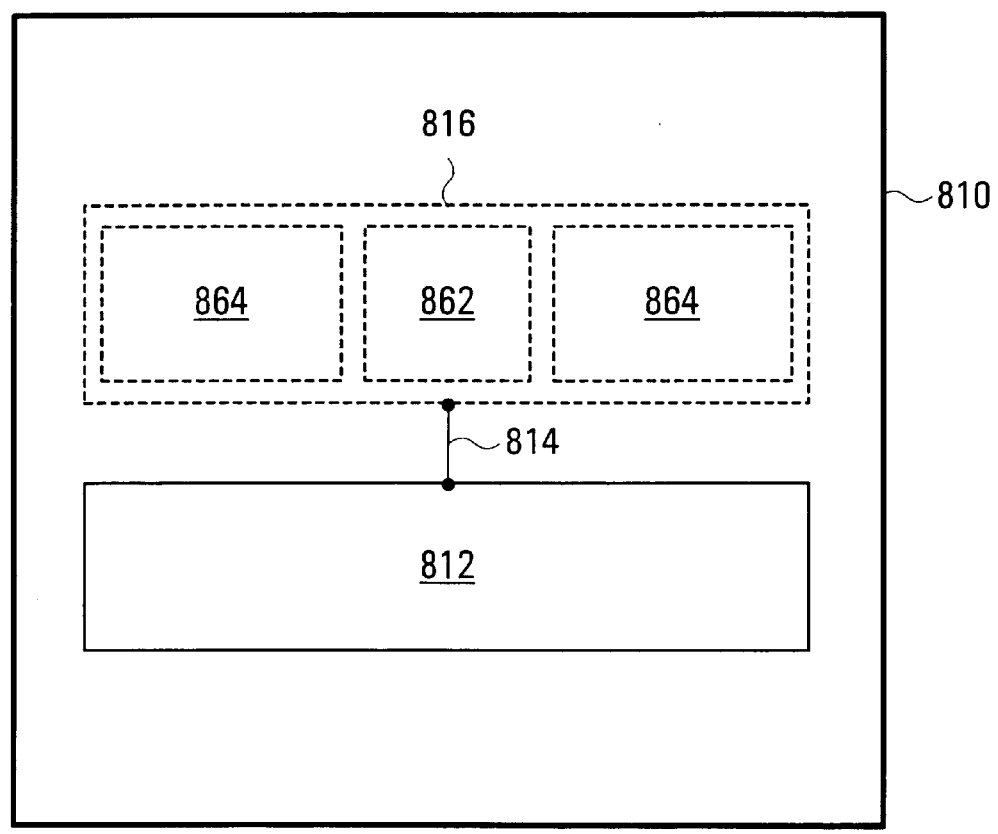
FIG. 8 shows a substrate capable of accommodating an integrated circuit and having a operationally redundant region, in accordance with still another embodiment of the present invention.

Another alternative embodiment of the present invention is shown in FIG. 8. In this case, translation, rather than rotation, of the integrated circuit. Of course, both a combination of translational and rotational motion is also within the scope of the present invention. In the specific case of FIG. 8, the bonding area 816 includes a plurality of regions, of which region 862 is operationally redundant. Another region 864, consisting of two portions separated by region 862, is non-operationally-redundant. It should be understood that the operationally redundant region 862 may be located at an extremity of the bonding area 816. Region 862 and the two portions of region 864 occupy adjacent positions within the bonding area 816. Connectors are provided between the substrate circuitry 812 and the region of the substrate that is non-operationally-redundant, namely region 864. It is noted that the bonding area 816 may be purposefully designed to be larger than the integrated circuit that it is intended to accommodate.

Figure 9A:
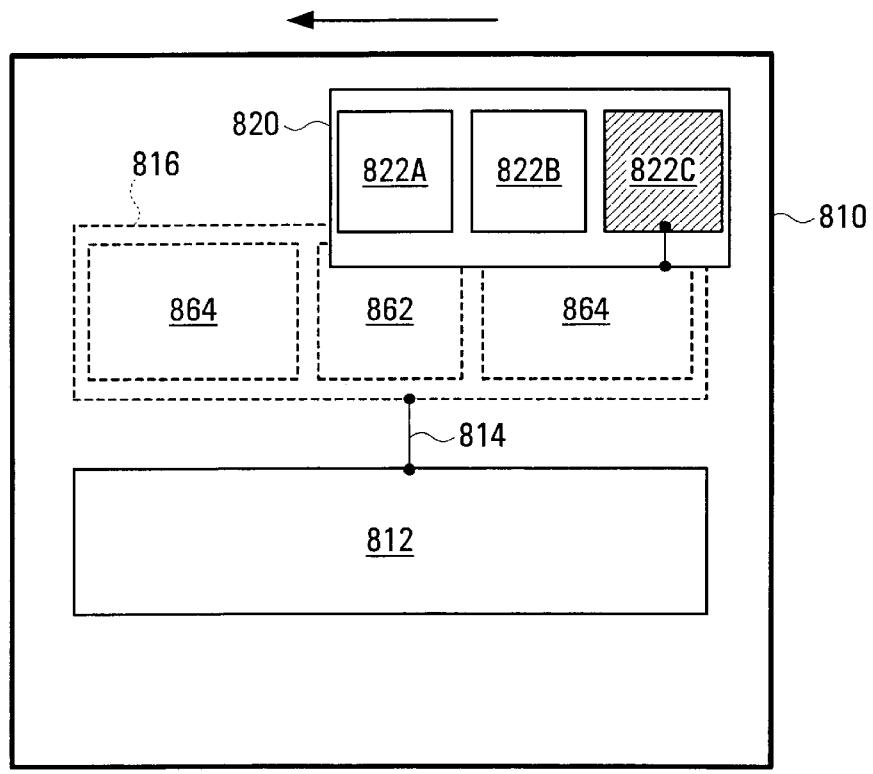
FIG. 9A shows a rectangular body of semiconductor material having a defective functional unit and about to be overlaid onto the substrate of FIG. 8.
Figure 9B:
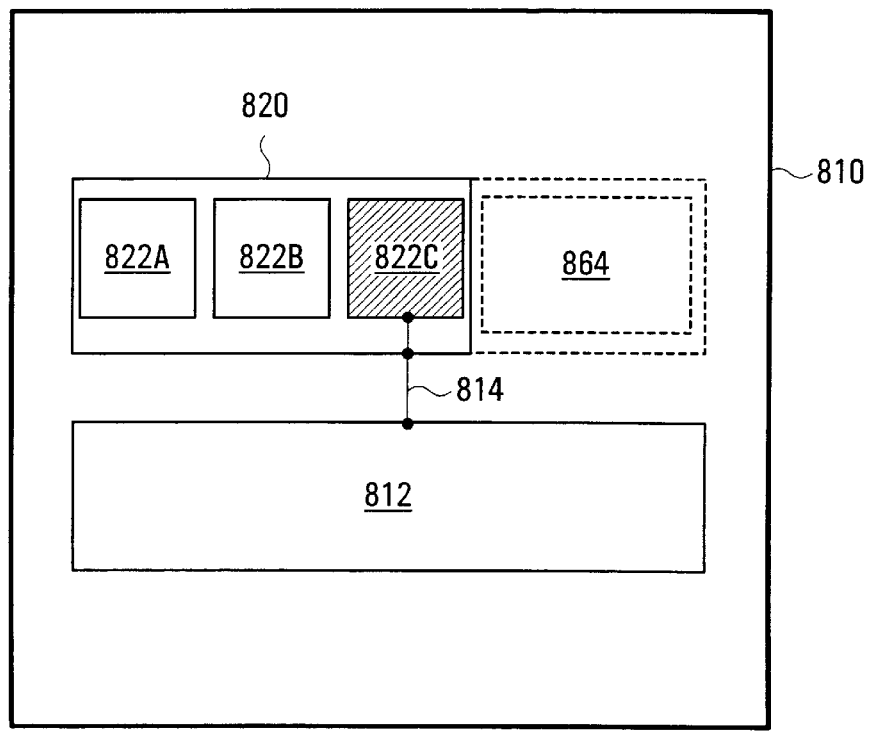
FIG. 9B shows the body and substrate of FIG. 8 with the body translated so that the defective functional unit overlies the operationally redundant region.

In FIG. 9A, there is shown an integrated circuit 920 that contains a defective cell 922C at a right-hand extremity, whereas the operationally redundant region 862 of the substrate is in a centrally disposed location of the bonding area 816. Thus, the integrated circuit 920 needs to be moved (translated) towards the left so that the defective cell 922C can overlay the operationally redundant region 862 of the substrate 810. Accordingly, FIG. 9B shows the situation in which the integrated circuit 920 has been rotated so that the defective cell 922C now overlies the operationally redundant region 862 of the substrate 810. The other cells 922A, 922B occupy part of the operational region 864 of the substrate 810.

In the above embodiments, the operationally redundant region is fixed with respect to the substrate. However, it is to be understood that the present invention also applies to cases in which the physical manipulation of the chip or substrate can be reduced by providing dynamic re-location of the operationally redundant region. For instance, it is within the scope of the present invention to provide a switching unit as part of the substrate circuitry, for controlling which of the regions is the operationally redundant one.

From the above, those skilled in the art will appreciate that the body of semiconductor material is capable of acquiring several different positions on the substrate. In a first position, a defective cell faces the operationally redundant region, while in a second position, the defective cell does not face the operationally redundant region. In other cases, the body of semiconductor material is capable of acquiring N possible positions on the substrate, where N corresponds to the number of cells.

In various example embodiments of the present invention, the integrated circuit may be made from a material such as silicon, germanium, gallium arsenide and any combination thereof, among other materials currently or prospectively known. The integrated circuit may also be implemented on a wafer of such material.

In various other embodiments of the present invention, a certain number of other cells may be required in addition to those that are interchangeable. In such a case, defects among mandatory cells might not be tolerated. However, defects amongst the interchangeable cells are tolerated in the above described way, allowing a reduction in the number of integrated circuits that need to be discarded.

While specific embodiments of the present invention have been described and illustrated, it will be apparent to those skilled in the art that numerous modifications and variations can be made without departing from the scope of the invention as defined in the appended claims.

What is claimed is:

1. A chip assembly, comprising:
   a. a body of semiconductor material including an integrated circuit, said integrated circuit having a plurality of externally communicating functional units, at least one of said externally communicating functional units being defective;
   b. a substrate on which said body of semiconductor material is mounted, said substrate including a plurality of regions, at least one of said regions being operationally redundant;
   c. said body of semiconductor material being positioned on said substrate such that each externally communicating functional unit other than the externally communicating functional unit that is defective is functionally associated with a respective one of said plurality of regions other than the region that is operationally redundant.

2. A chip assembly as defined in claim 1, wherein each functional unit faces a respective one of said plurality of regions and wherein the externally communicating functional unit that is defective faces the region that is operationally redundant.

3. A chip assembly as defined in claim 2, further comprising a plurality of discrete signal transmission channels, wherein each discrete signal transmission channel functionally associates a respective one of the externally communicating functional units to a respective one of said plurality of regions.

4. A chip assembly as defined in claim 3, wherein said chip is free of a discrete signal transmission channel functionally associating the externally communicating functional unit that is defective to the region that is operationally redundant.

5. A chip assembly as defined in claim 4, wherein at least some of said discrete signal transmission channels include electrical conductors.

6. A chip assembly as defined in claim 5, wherein the externally communicating functional units have an identical architecture.

7. A chip assembly as defined in claim 6, wherein each region other than the region that is operationally redundant includes a plurality of contact elements connected to a respective discrete signal transmission pathway.

8. A chip assembly as defined in claim 1, said substrate being a printed circuit board.

9. A chip assembly as defined in claim 1, further comprising a marker disposed on said semiconductor body, wherein said operationally redundant region is in a predetermined orientation with respect to said marker.

10. A chip assembly as defined in claim 9, wherein said marker includes a printed logo.

11. A chip assembly as claimed in claim 1, wherein said substrate includes circuitry for selecting which region of the substrate is an operationally redundant region.

12. In combination:
   a. a body of semiconductor material including an integrated circuit, said integrated circuit having a plurality of externally communicating functional units, at least one of said externally communicating functional units being defective;
   b. a substrate for receiving said body of semiconductor material, said substrate including a plurality of regions, at least one of said regions being operationally redundant;
   c. said body of semiconductor material being capable of acquiring a first position and a second position on said substrate;
   d. wherein, in said first position, each externally communicating functional unit faces a first respective one of said plurality of regions, the externally communicating functional unit that is defective facing the region that is operationally redundant, and
   e. wherein, in said second position, each externally communicating functional unit faces a second respective one of said plurality of regions, the externally communicating functional unit that is defective facing a region that is other than the region that is operationally redundant.

13. A combination as defined in claim 12, wherein said body of semiconductor material is capable of acquiring at least N possible positions on said substrate, where N corresponds to the number of externally communicating functional units in said plurality of externally communicating functional units.

14. A combination as defined in claim 13, wherein said body of semiconductor material is movable from one position to another on said substrate by rotation.

15. A combination as defined in claim 13, wherein said body of semiconductor material is movable from one position to another on said substrate by translation.

16. A combination as defined in claim 12, wherein the externally communicating functional units have an identical architecture.

17. A combination as defined in claim 12, wherein the externally communicating functional units are structurally interchangeable.

18. A method of mounting a body of semiconductor material to a substrate, the body of semiconductor material including an integrated circuit having a plurality of externally communicating functional units, the substrate including a plurality of regions, at least one of the regions being operationally redundant, the method comprising:
   a. testing said integrated circuit for the presence of an externally communicating functional unit that is defective;
   b. if a defective externally communicating functional unit is found, mounting said body of semiconductor material on said substrate such that the defective externally communicating functional unit registers with the region that is operationally redundant.

19. A method as defined in claim 18, comprising establishing a discrete signal transmission channel between each externally communicating functional unit other than the defective externally communicating functional unit and a respective region that is other than the region that is operationally redundant.

20. A method as defined in claim 19, wherein said discrete signal transmission channel includes electrical conductors.

21. A method as defined in claim 20, wherein the externally communicating functional units have an identical architecture.

22. A method as defined in claim 19, wherein each region other than the region that is operationally redundant includes contact elements, said method including connecting the discrete signal transmission channel to said contact elements.

23. A method as defined in claim 18, comprising rotating said body of semiconductor material on said substrate to overlay the defective externally communicating functional unit onto the region that is operationally redundant.

24. A method as defined in claim 18, comprising translating said body of semiconductor material on said substrate to overlay the defective externally communicating functional unit onto the region that is operationally redundant.

25. A method as defined in claim 18, comprising rotating and translating said body of semiconductor material with respect to said substrate, thereby to overlay the defective externally communicating functional unit onto the region that is operationally redundant.

26. A method as defined in claim 18, wherein the region of the substrate that is operationally redundant occupies a sector of the substrate.

27. A method as defined in claim 18, wherein the region of the substrate that is operationally redundant occupies a quadrant of the substrate.

28. A chip manufactured by the method of claim 18.

29. A method of positioning a body of semiconductor material with respect to a substrate, the body of semiconductor material including an integrated circuit having a plurality of externally communicating functional units, the substrate having a plurality of regions, at least one of the regions being operationally redundant, the method comprising:
   a. testing said integrated circuit for the presence of a externally communicating functional unit that is defective;
   b. if a defective externally communicating functional unit is found, orienting said body of semiconductor material on said substrate such that the defective externally communicating functional unit overlies the region that is operationally redundant.

30. A method of positioning a body of semiconductor material with respect to a marker positioning device, the body of semiconductor material including an integrated circuit having a plurality of externally communicating functional units, the method comprising:
   a. testing said integrated circuit for the presence of a externally communicating functional unit that is defective;
   b. applying a marker to a surface of said semiconductor body; and
   c. prior to step b, if a defective externally communicating functional unit is found, orienting said body of semiconductor material with respect to said marker positioning device such that the marker, when applied, occupies a pre-determined orientation with respect to said defective externally communicating functional unit.

31. A method as defined in claim 30, wherein applying a marker comprises printing a logo onto said surface of said semiconductor body.

* * * * *